United States Patent
Yoshimura et al.

(10) Patent No.: US 11,799,468 B2
(45) Date of Patent: Oct. 24, 2023

(54) SEMICONDUCTOR DEVICE AND CONTROL SYSTEM

(71) Applicant: Renesas Electronics Corporation, Tokyo (JP)

(72) Inventors: Naohiro Yoshimura, Tokyo (JP); Makoto Tanaka, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 17/942,259

(22) Filed: Sep. 12, 2022

(65) Prior Publication Data

US 2023/0095018 A1 Mar. 30, 2023

(30) Foreign Application Priority Data

Sep. 27, 2021 (JP) ................................ 2021-156926

(51) Int. Cl.
| | |
|---|---|
| *H02H 9/04* | (2006.01) |
| *H03K 17/082* | (2006.01) |
| *H03K 17/687* | (2006.01) |
| *H02H 9/02* | (2006.01) |
| *H02M 3/158* | (2006.01) |

(52) U.S. Cl.
CPC ........... *H03K 17/0822* (2013.01); *H02H 9/02* (2013.01); *H02H 9/041* (2013.01); *H02M 3/158* (2013.01); *H03K 17/687* (2013.01); *H03K 2217/0063* (2013.01)

(58) Field of Classification Search
CPC ............ H02H 9/02; H02H 9/04; H02H 9/041; H03K 17/0822; H03K 17/687; H03K 2217/0063; H03K 2217/0072
USPC .................................................. 327/108, 110
See application file for complete search history.

(56) References Cited

U.S. PATENT DOCUMENTS

| | | | | |
|---|---|---|---|---|
| 5,859,757 A * | 1/1999 | Hanafusa | ................ | G05F 1/575 361/93.7 |
| 6,201,674 B1 * | 3/2001 | Warita | .................... | G05F 1/573 361/18 |
| 10,348,079 B2 * | 7/2019 | Yasusaka | ........... | H03K 17/0822 |
| 10,547,170 B2 * | 1/2020 | Nakahara | ............. | H03K 17/145 |
| 2005/0013079 A1 * | 1/2005 | Mitsuda | ................. | H02H 3/087 361/100 |
| 2005/0162189 A1 * | 7/2005 | Tanabe | ............... | H03K 17/0822 326/82 |
| 2007/0171590 A1 * | 7/2007 | Nagata | ................... | H03K 17/18 361/93.1 |

(Continued)

FOREIGN PATENT DOCUMENTS

| | | |
|---|---|---|
| JP | 2016208406 A | 12/2016 |
| JP | 2017212522 A | 11/2017 |

*Primary Examiner* — William Hernandez
(74) *Attorney, Agent, or Firm* — SCULLY, SCOTT, MURPHY & PRESSER, P.C.

(57) ABSTRACT

Detection transistor MNd flows a detection current IdN to a current path CP1$n$ when an output voltage Vo generated in a load terminal PN1 is than a ground voltage GND. A current mirror circuit CMp1 transfers the detection current IdN flowing in the current path CP1$n$ to a current path CP2$a$. Detecting resistor element Rd1 converts a mirror current I2$a$ flowing in the current path CP2$a$ to a detection voltage Vd1. A control transistor MNc1 is turned on when the converted detection voltage Vd1 is higher than a predetermined value. Then, the output transistor QO is controlled to be off while the control transistor MNc1 is on.

14 Claims, 14 Drawing Sheets

(56) References Cited

U.S. PATENT DOCUMENTS

| | | | | |
|---|---|---|---|---|
| 2008/0112103 A1* | 5/2008 | Matsuda | ............... | G05F 1/56 |
| | | | | 361/90 |
| 2008/0247108 A1* | 10/2008 | Ando | ............... | H02H 7/0833 |
| | | | | 361/84 |
| 2015/0155699 A1* | 6/2015 | Yasusaka | ......... | H03K 17/0822 |
| | | | | 361/101 |
| 2015/0288171 A1* | 10/2015 | Yoshida | ............ | H02H 9/025 |
| | | | | 361/87 |
| 2016/0311327 A1* | 10/2016 | Nakahara | ......... | H03K 17/0822 |

* cited by examiner

SEMICONDUCTOR DEVICE AND CONTROL SYSTEM

CROSS-REFERENCE TO RELATED APPLICATIONS

The disclosure of Japanese Patent Application No. 2021-156926 filed on Sep. 27, 2021, including the specification, drawings and abstract is incorporated herein by reference in its entirety.

BACKGROUND

The present invention relates to a semiconductor device, for example, a semiconductor device for power control.

In the semiconductor device for power control, when switching a current supply to the inductive load such as a solenoid or a motor from on to off, a back electromotive force (EMF) voltage is generated by the electromagnetic energy stored in the load is released. To prevent an output transistor is destroyed by the back EMF voltage, there is a case where a dynamic clamping circuit for clamping the back EMF voltage to a predetermined clamping voltage is mounted in a semiconductor device.

Patent document 1 and Patent document 2 disclose a semiconductor device in which such the dynamic clamp circuit is mounted. The dynamic clamping circuit schematically clamps the back EMF voltage by increasing the gate voltage of the output transistor and half-turning on the output transistor when the drain-source voltage of the output transistor exceeds a predetermined value.

PRIOR-ART DOCUMENT

Patent Document

[Patent Document 1] Japanese Unexamined Publication Laid-Open No. 2016-208406
[Patent Document 2] Japanese Unexamined Publication Laid-Open No. 2017-212522

SUMMARY

For example, as shown in Patent Documents 1 and 2, in the method of clamping the back EMF voltage by half-on of the output transistor, there is a possibility that the operating point of the output transistor at half-on timing is out of range of a safety operating area (SOA). Especially, in the output transistor with reduced on-resistance using a super junction structure or the like, there is a case where the SOA associated with the secondary breakdown becomes narrow. In this case, it may be more difficult to satisfy the SOA.

Other objects and novel features will become apparent from the description of this specification and the accompanying drawings.

A semiconductor device according to an embodiment includes a first power supply terminal to which a first power supply voltage is applied; a second power supply terminal to which a second power supply voltage lower than the first power supply voltage is applied; a load terminal to which a load is coupled; an output transistor which is coupled between the first power supply terminal and the load terminal and is controlled based on a control voltage between a control node thereof and the load terminal; a driver which controls the control voltage based on a control input signal; a first current path formed between the first power supply terminal and the load terminal; a detection transistor which is inserted in the first current path and flows a detection current to the first current path in a period when an output voltage generated at the load terminal is lower than the second power supply voltage; a current mirror circuit that transfers the detection current flowing through the first current path to a second current path; a detection resistor element which is inserted in the second current path and convers a current flowing through the second current path to a detection voltage; and a control transistor which is turned on in a period when the detection voltage converted by the detection resistor element is higher than a predetermined value, wherein the output transistor is controlled to an off-state in a period when the control transistor is in an on-state.

According to the one embodiment, it is possible to prevent breakdown due to secondary breakdown of the output transistor.

DETAILED DESCRIPTION

Figure 1:
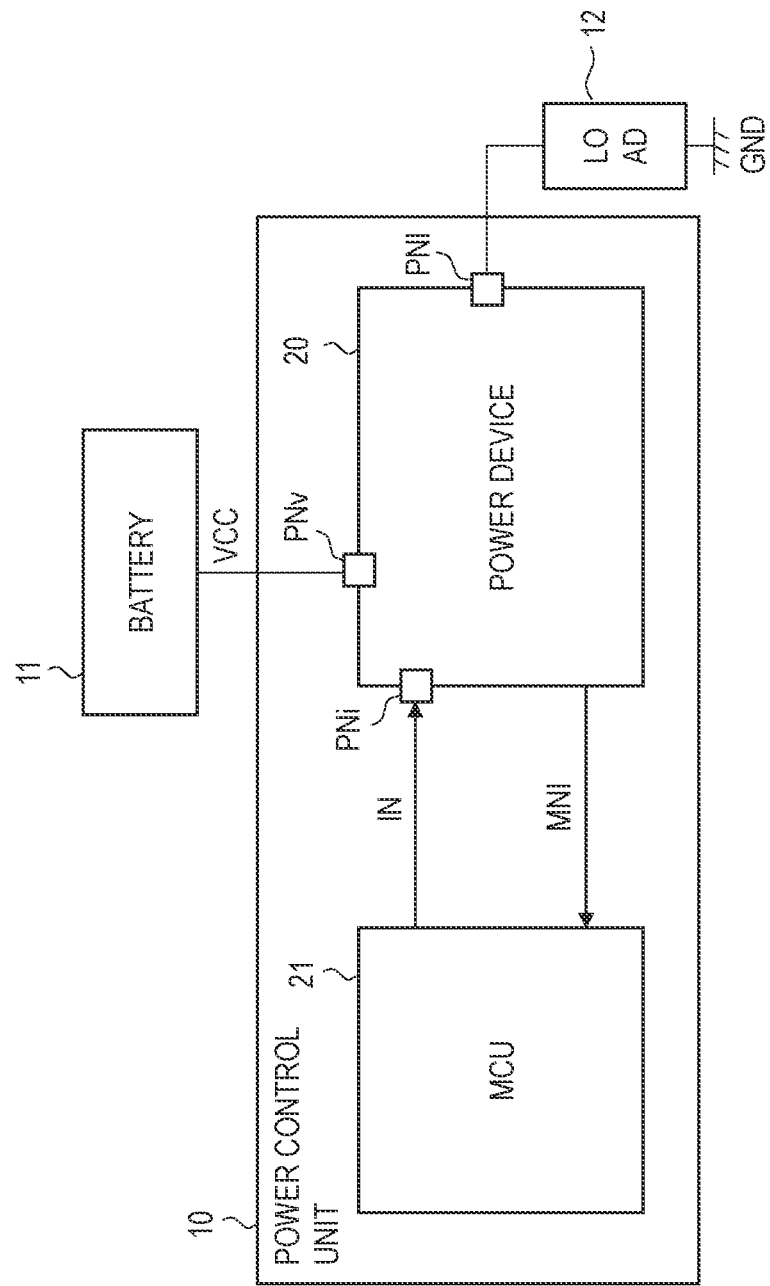
FIG. 1 is a block diagram showing a schematic configuration example around the power control unit to which the semiconductor device according to a first embodiment is applied.

If necessary for convenience in the following embodiments, they will be divided into sections or embodiments, but unless otherwise specified, they will not be irrelevant to each other, one of which will be subject to modifications, details, supplementary explanations, or the like of some or all of the others.

In addition, in the following embodiments, the number of elements or the like (including the number, the value, the amount, the range, and the like) is not limited to the specific number, and may be more than or less than the specific number, except in the case where it is specifically specified and the case where it is obviously limited to the specific number in principle.

Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments of the present invention are described in detail with reference to the drawings. In all the drawings for explaining the embodiments, the same members are denoted by the same reference numerals in principle, and repetitive descriptions thereof are omitted.

First Embodiment

<Schematic of Power Control Unit>

Figure 2:
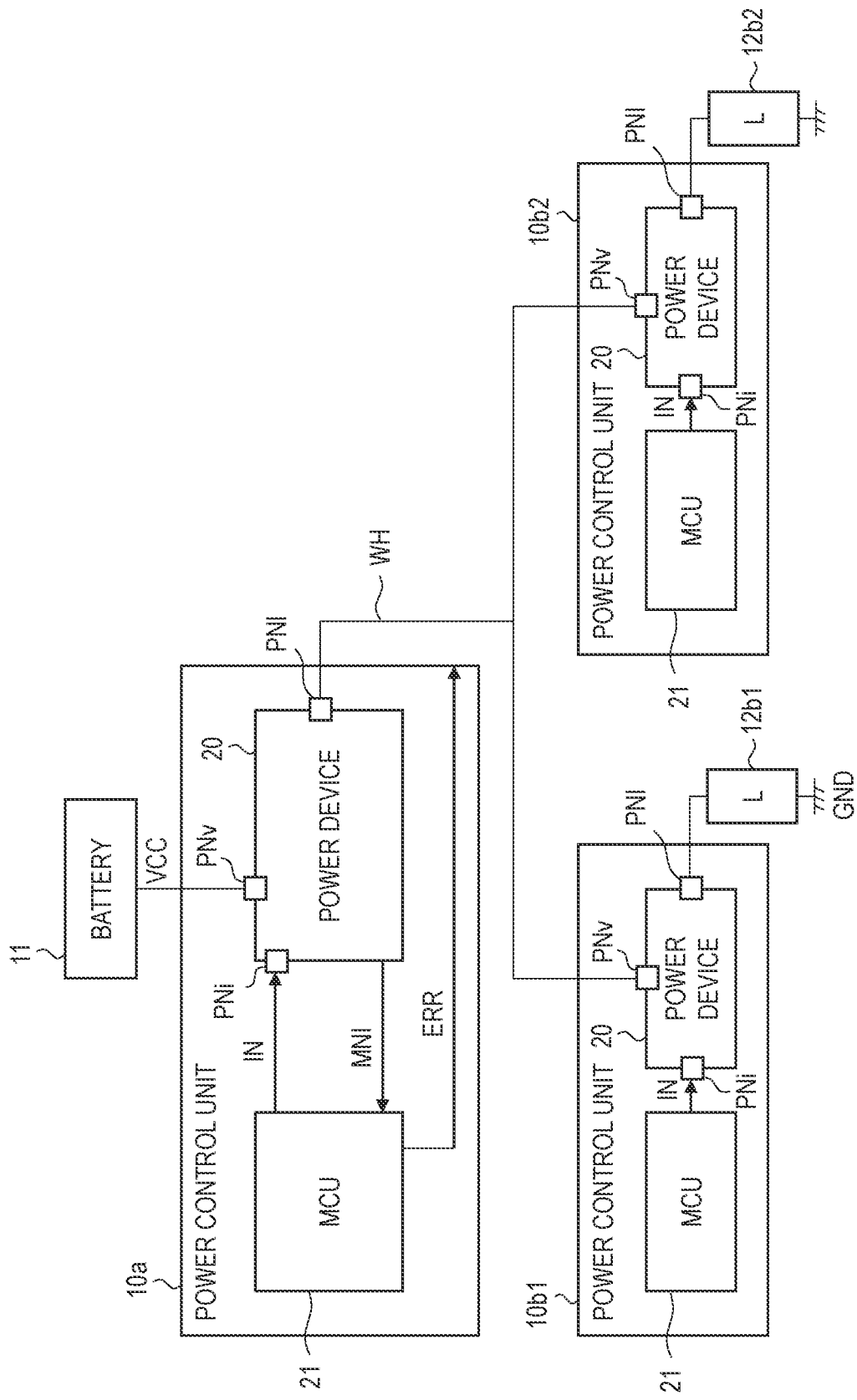
FIG. 2 is a block diagram showing a schematic configuration example of a power control system to which the semiconductor device according to the first embodiment is applied.

FIG. 1 is a block diagram showing a schematic configuration example around the power control unit to which the semiconductor device according to the first embodiment is applied. FIG. 2 is a block diagram showing a schematic configuration example of a power control system to which the semiconductor device according to the first embodiment is applied. Each of power control units 10, 10a, 10b1, 10b2 shown in FIG. 1 or FIG. 2, is, for example, an engine control unit for vehicle (ECU) or the like. The power control units 10, 10a, 10b1, and 10b2 have functions for controlling power supply from a battery 11 to a load 12.

The power control unit 10 shown in FIG. 1 includes a power device 20 which is a semiconductor device, and a microcomputer (referred to as an MCU) 21. For example, each of the power device 20 and MCU 21 is composed of one semiconductor chip, is mounted on the wiring board constituting the power control unit 10. Power device 20 includes, for example, a power semiconductor element such as MOSFET (Metal Oxide Semiconductor Field Effect Transistor) and IGBT (Insulated Gate Bipolar Transistor). In the first embodiment, the power device 20 includes an IPD (Intelligent Power Device) including, for example, a MOSFET and a control circuit including drivers and various protective circuits for the MOSFET.

Power device (semiconductor device) 20 includes a high-potential side power supply terminal PNv to which a high-potential side power supply voltage VCC is applied, a load terminal PNl coupled to the load 12, and a control input terminal PNi for inputting a control input signal IN. The high-potential side power supply voltage VCC is generated by the battery 11, for example, has a voltage value such as 12 to 15 V. Load 12 is an inductive load, a resistive load or a capacitive load. The inductive load is, for example, a solenoid, a motor, a coil, or the like. Load 12, with reference to a low-potential side power supply voltage GND, operates by receiving the high-potential side power supply voltage from the load terminal PNl.

In the specification, the high-potential side power supply voltage VCC and the high-potential side power supply terminal PNv are simply referred to as a power supply voltage VCC and a power supply terminal PNv, respectively. Further, the low-potential side power supply voltage GND is referred to as a ground voltage GND. The ground voltage GND is 0 V.

MCU 21 has the function of controlling the power device 20. MCU 21, for example, by outputting a control input signal IN representing on/off states of the power supply to the power device 20, controls the power device 20. Power device 20, based on the control input signal IN, on/off the power supply from the battery 11 to the load 12, i.e., switches a conduction/non-conduction between the power supply terminal PNv and the load terminal PNl. In this manner, the power device 20 has a function as a power switch.

Further, the power device 20 outputs various monitor signals MNIs to MCU 21. As the monitor signal MNI, for example, an abnormality detection signal from various protection circuits (not shown) or a current sense signal from a current sense circuit (not shown) may be exemplified. The various protection circuits protect the power semiconductor element from overvoltage, overcurrent, overtemperature, etc. The current sense circuit is a circuit for sensing the output current flowing from the power semiconductor element to the load terminal PNl. Although not shown, a DCDC converter or the like converting the voltage of the power supply voltage VCC from the battery 11 to supply the converted voltage to the MCU 21 can also be mounted in the power control unit 10.

In FIG. 2, a power control system is shown in which a plurality of the power control units described in FIG. 1 is provided hierarchically. The power control system includes a power control unit 10a as a host unit, and a plurality of power control units 10b1 and 10b2 as lower units (two in this example). Each of the power control units 10a, 10b1, and 10b2 includes the power device 20 and the MCU 21 as in FIG. 1.

In the power device 20 in the power control unit 10a which is the host unit, the power supply voltage VCC from the battery 11 is applied to the power supply terminal PNv. The load terminal PNl is coupled to the power control unit 10b1, 10b2 which are the lower units via a wire harness WH or the like. That is, the lower units operate as the load for the host unit.

On the other hand, the power supply voltage Vcc from the battery 11 is supplied to the power supply terminals PNvs of the power control units 10b1 and 10b2 in common via the power control unit 10a and the wire harness WH or the like. Further, the load terminals PNls of the power control units 10b1 and 10b2 are coupled to the loads 12b1 and 12b2, respectively.

The power device 20 in the power control unit 10a controls on/off states of the power supply from the battery 11 to the plurality of power control units 10b1 and 10b2 based on the control input signal IN from the corresponding MCU 21. On the other hand, the power devices 20 in the power control units 10b1 and 10b2 control on/off states of the power supply from the power control unit 10a to the loads 12b1 and 12b2, respectively, based on the control input signal IN from the corresponding MCU 21. In this example, MCU 21 in the power control unit 10a performs an error notification on a display or the like (not shown) using an error signal ERR when, for example, a serious abnormality is detected based on the monitor signal MNI from the power device 20.

<Device Configuration of Power Device>

Figure 3:
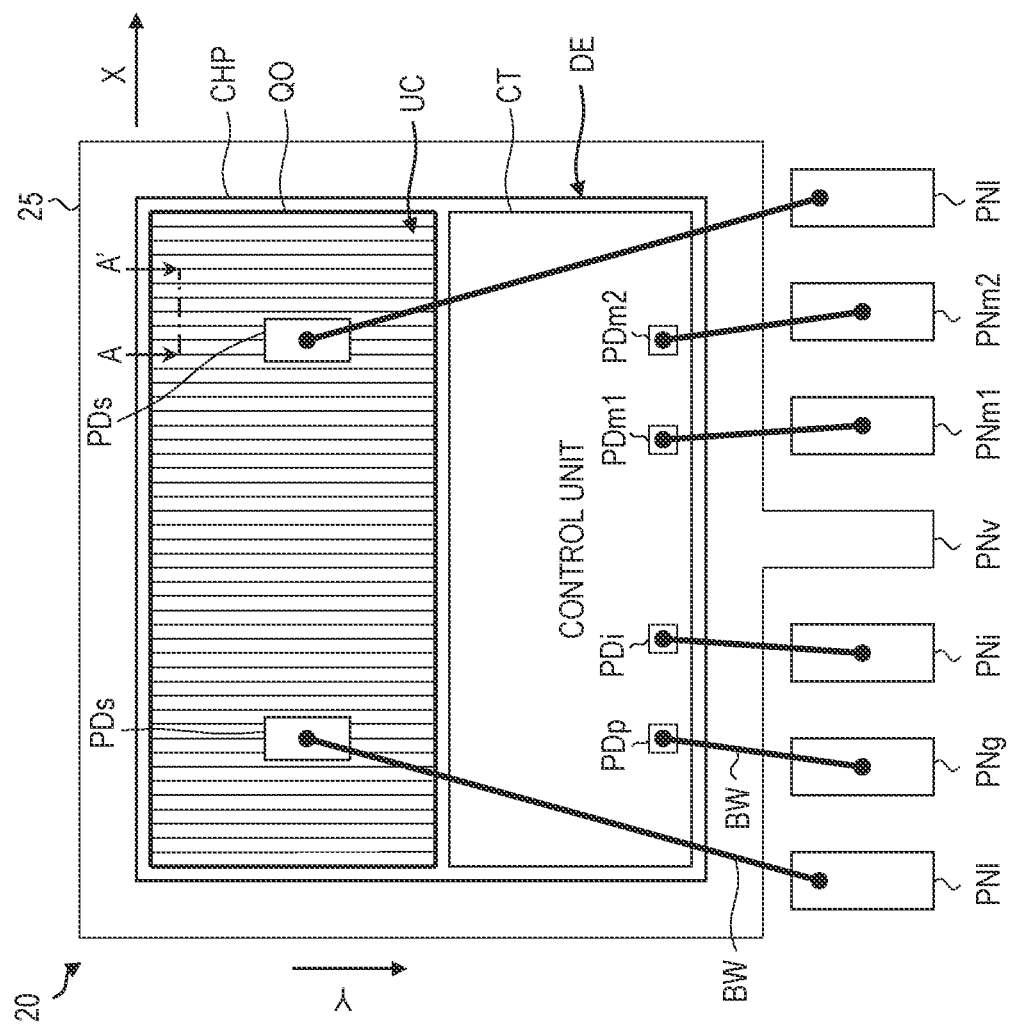
FIG. 3 is a plan view showing an outline example of a power device in FIGS. 1 and 2.

FIG. 3 is a plan view showing an outline example of the power device in FIGS. 1 and 2. Power device 20 is implemented, for example, in a package encapsulated semiconductor chip CHP. The package has a form, in this instance, referred to as a TO252-7 pin. The semiconductor chip CHP includes an output transistor QO and a control circuit CT for controlling the output transistor QO. The control circuit CT includes a driver of the output transistor QO, various protective circuits, and the like.

The external terminal of the package, i.e., the lead, includes a low potential side power supply terminal PNg and monitor terminals PNm1, PNm2 in addition to the load terminal PNl, the control input terminal PNi and the power supply terminal PNv described in FIG. 1. The ground voltage GND is applied to the low potential side power supply terminal PNg. In the specification, the low potential side power supply terminal PNg is referred to as a ground terminal PNg. The monitor terminals PNm1, PNm2 are terminals for the monitor signal MNI described in FIG. 1.

The semiconductor chip CHP is mounted on the lead frame 25 constituting the package. The lead frame 25 is connected to the power supply terminal PNv. Here, on the back surface of the semiconductor chip CHP, the drain electrode DE of the output transistor QO is formed. As a result, the power supply terminal PNv is connected to the drain electrode DE. The output transistor QO is composed of a plurality of unit cells UCs. The plurality of unit cells UCs is arranged side by side in the X-axis direction. Each of the plurality of unit cells UCs is formed to extend in the Y-axis direction.

On the main surface side of the semiconductor chip CHP, the source pad PDs is formed which is a part of the source electrode of the output transistor QO. Source pads PDs are connected via a bonding wire BW to the load terminals PNls. In this example, in order to sufficiently ensure the output current, two load terminals PNls are provided. Furthermore, on the main surface of the semiconductor chip CHP, the power pad PDp, the control input pad PDi, and the monitor pads PDm1, PDm2 are formed. Power pad PDp is connected via a bonding wire BW to the ground terminal PNg. The control input pad PDi and the monitor pads PDm1, PDm2 are respectively connected to the control input terminal PNi and the monitor terminals PNm1, PNm2 via the bonding wire BW.

Figure 4:
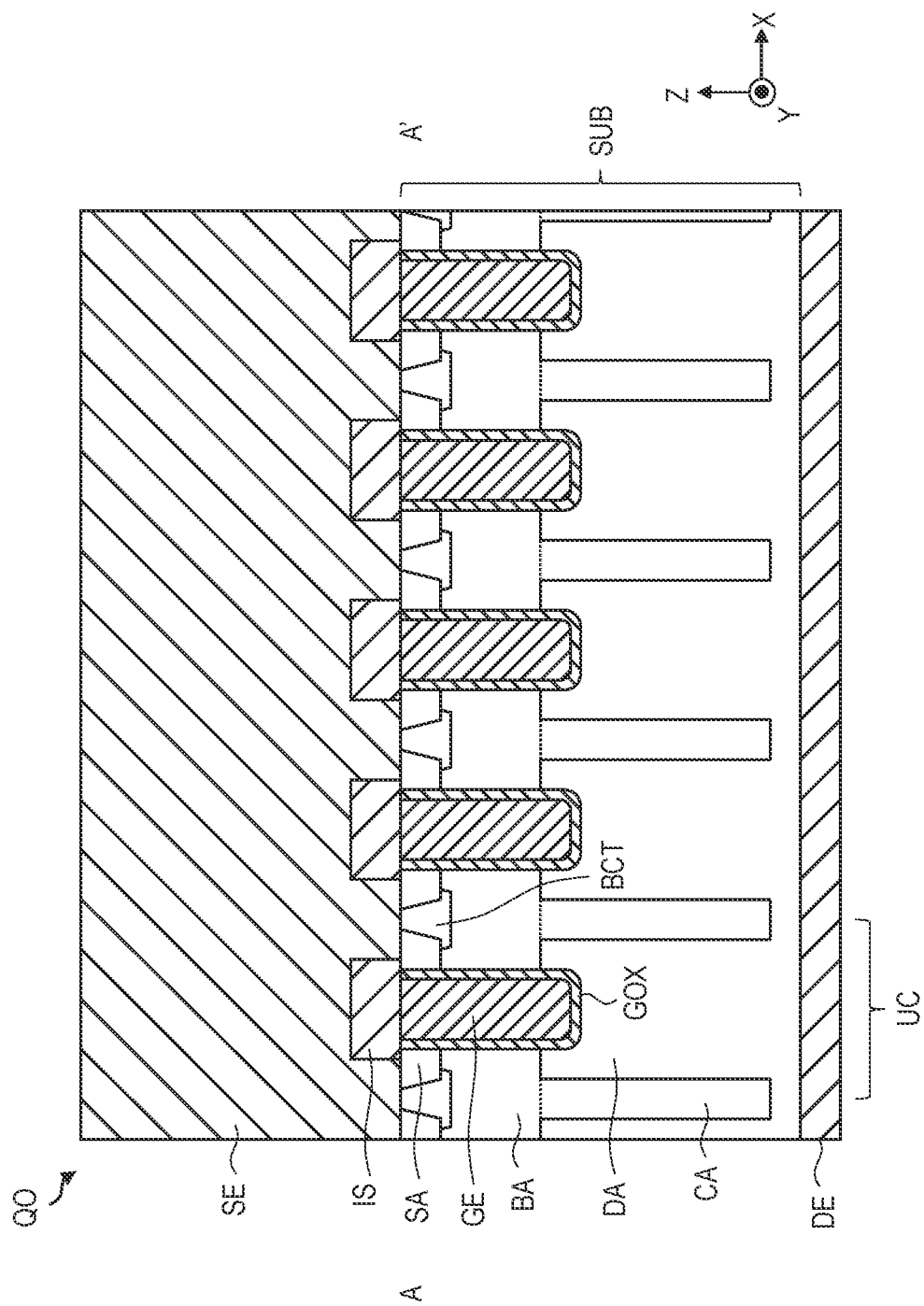
FIG. 4 is a cross-sectional view illustrating exemplary configuration between A-A' of an output transistor of FIG. 3.

FIG. 4 is a cross-sectional view illustrating exemplary configuration between A-A' of the output transistors of FIG. 3. Output transistor QO shown in FIG. 4 is, for example, an n-channel type MOSFET formed on the semiconductor-substrate SUB. The unit cell UC constituting the output transistor QO has a drain region DA, a base region BA, a gate electrode GE, a back gate contact region BCT, a source region SA and a column region CA formed on the semiconductor substrate SUB.

Drain region DA is, for example, an n-type region and is disposed on the back side of the semiconductor substrate SUB. On the back surface of the drain region DA, i.e., on the back surface of the semiconductor substrate SUB, the drain electrode DE is formed. Base region BA is, for example, a p-type region and is formed on the main surface of the drain region DA. Gate electrode GE, so as to reach the drain region DA from the main surface side of the base region BA, is embedded in the semiconductor substrate SUB. That is, the gate electrode GE has a trench gate structure. Further, the gate electrode GE is covered by the gate oxide film GOX.

Back gate contact region BCT is, for example, a p+ type region and is formed in the central portion between the adjacent gate electrodes GEs in the main surface side of the base region BA. The source region SA is, for example, an n+ type region and is formed between the back gate contact region BCT and the gate electrode GE. Furthermore, on the main surface of the semiconductor substrate SUB, the source electrode SE is formed. The source electrode SE is in contact with the source region SA and the back gate contact region BCT. A protective film (not shown) or the like is formed on the source electrode SE. The source pads PDs shown in FIG. 3 correspond to openings of the protective film.

On the other hand, the column region CA is, for example, a p-type region and is formed so as to extend from the back surface of the base region BA to the back side of the semiconductor substrate SUB. That is, in the X-axis direction, the column region CA and the drain region DA are arranged so as to be adjacent to each other. In MOSFET of a common trench gate structure, the column area CA is not formed, the drain area DA is, for example, n− type region to ensure a breakdown voltage. On the other hand, in the configuration example of FIG. 4, the column region CA is formed, and the drain region DA is, for example, an n-type region having a higher concentration than that of the n− type.

The configuration example as shown in FIG. 4 is called as a super junction structure. In the super junction structure, when the output transistor QO is ON, low on-resistance is achieved by passing electrons through the drain region DA with low specific resistance. On the other hand, when the output transistor QO is OFF, high breakdown voltage is realized by depleting the drain region DA and the column region CA. That is, by using a super junction structure, while maintaining the high-speed switching characteristics of the output transistor QO, it is possible to obtain a high breakdown voltage and low on-resistance characteristics.

Incidentally, the control circuit CT shown in FIG. 3, unlike the output transistor QO, includes a MOSFET formed by a common CMOS (Complementary MOS) process, a capacitor, a diode, a resistor or the like. In the specification, the normal MOSFET mounted on the control circuit CT is referred to as a MOS transistor, distinguished from the output transistor QO, the re-channel type is referred to as a nMOS transistor, the p-channel type is referred to as a pMOS transistor. The output transistor QO is not necessarily limited to a super junction structure, a general trench gate structure, or may be a planar gate structure or the like. Furthermore, the output transistor QO is not limited to MOSFET and may be IGBT or the like.

<Circuit Configuration of Power Device (First Embodiment)>

Figure 5:
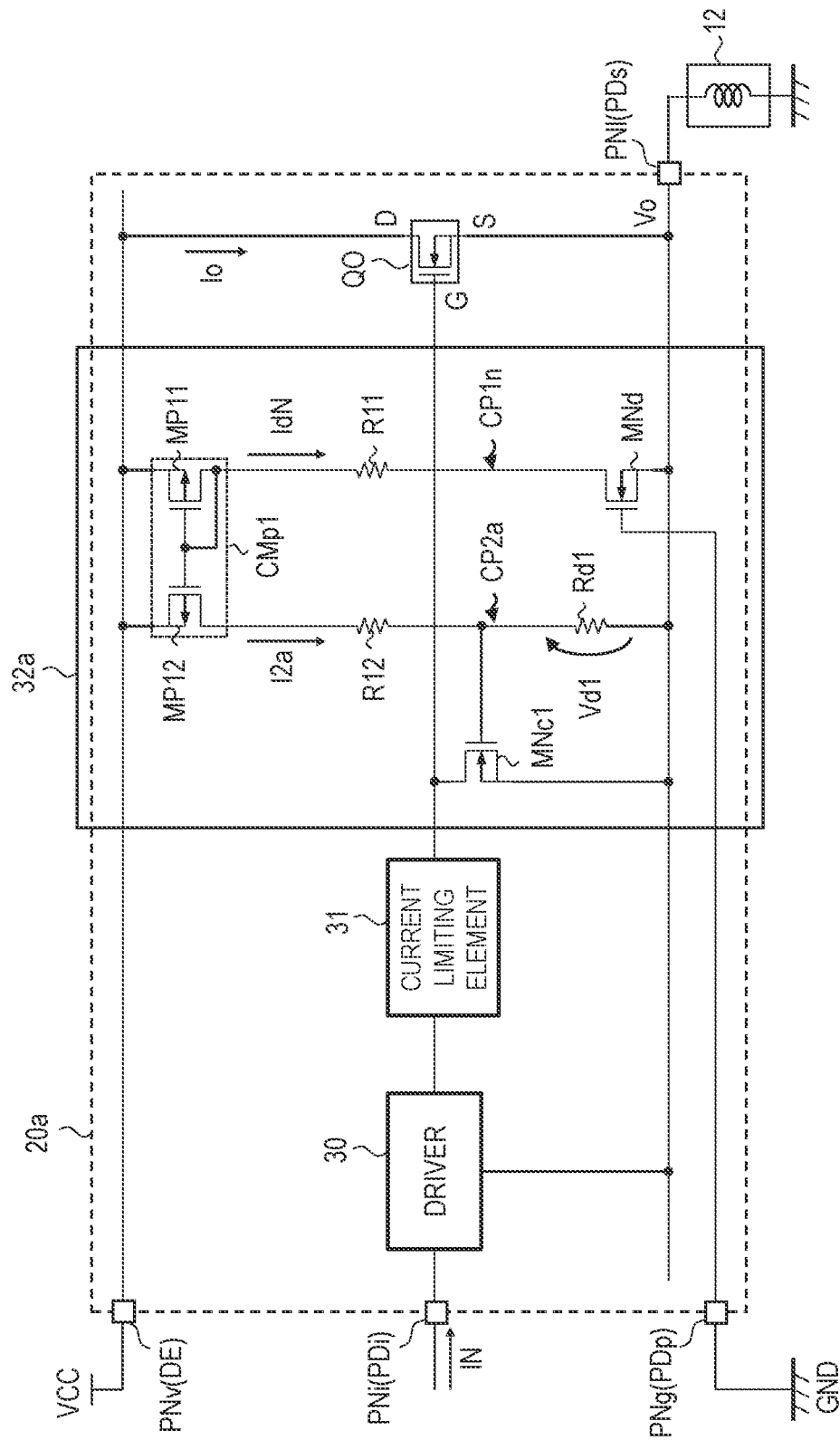
FIG. 5 is a circuit diagram showing a configuration example of a main portion of the power device in FIGS. 1 and 2.

FIG. 5 is a circuit diagram showing a configuration example of a main portion of the power device in FIGS. 1 and 2. Power device 20a shown in FIG. 5 includes the power supply terminal PNv to which power supply voltage VCC is applied, the control input terminal PNi for inputting the control input signal IN, the ground terminal PNg to which ground voltage GND is applied, the load terminal PNl connected to the load 12. The power device 20a includes the output transistor QO, a driver 30, a current limiting element 31, and a protection circuit 32a.

The output-transistor QO is, in this instance, n-channel type MOSFET. Drain (D) and source (S) of the output transistor QO, respectively, are connected to the power supply terminal PNv and the load terminal PNl. The output transistor QO is turned on/off based on the control voltage between the gate (G), which is a control node, and the source (S), which is connected to the load terminal PNl, that is, the gate-to-source voltage Vgs.

Here, as shown in FIG. 3, the power supply terminal PNv is also the drain electrode DE of the output transistor QO, the load terminal PNl is also the source pad PDs of the output transistor QO. The control input terminal PNi is also the control input pad PDi, the ground terminal PNg is also the power pad PDp. The load 12 is, for example, an inductive load, but may in some cases be a resistive load or the like. That is, for example, looking at the load 12 from the source pad PDs, even if the load 12 is a resistive load or the like, an inductance component such as a bonding wire BW may act as an inductive load.

Driver 30, based on the control input signal IN from the control input terminal PNi, controls the gate-source voltage Vgs of the output transistor QO. For example, if the control input signal IN is at a "H" level, the driver 30 controls the gate-source voltage Vgs of the output transistor QO to an ON level via the current limiting element 31. The ON level is, for example, the level of the power supply voltage VCC.

Thus, the gate-source voltage Vgs of the output transistor QO becomes larger than the threshold voltage (Vth) and the output transistor QO is turned on. When the output transistor QO is turned on, the output current Io flows through the output transistor QO, the output voltage Vo generated in the load terminal PNl is raised to the vicinity of the power supply voltage VCC. As a result, the power supply to the load 12 is turned on.

On the other hand, when the control input signal IN is at the "L" level, the driver 30 controls the gate-source voltage Vgs of the output transistor QO to the OFF level via the current limiting element 31. The OFF level is, for example, the level of the ground voltage GND. Thus, the gate-source voltage Vgs of the output transistor QO becomes smaller than the threshold voltage (Vth), the output transistor QO is turned off. When the output transistor QO is turned off, the output current Io does not flow and the power supply to the load 12 is turned off. Then, the output voltage Vo generated in the load terminal PNl is ultimately converged to the ground voltage GND.

Driver 30, although not shown, for example, is composed of a charge pump circuit or the like for generating the gate voltage by adding the value of the power supply voltage VCC to the output voltage Vo generated in the load terminal PNl. Current limiting element 31, so that a gate-to-source capacitance of the output transistor QO is not rapidly charged and discharged, limits a charging and discharging current by the driver 30 using a resistor element or the like. This prevents a rapid on-transition or off-transition of the output transistor QO. It is possible to suppress a noise. Details of the protection circuit 32a will be described later.

<Configuration and Operation of Power Device (Comparative Example)>

Figure 13A:
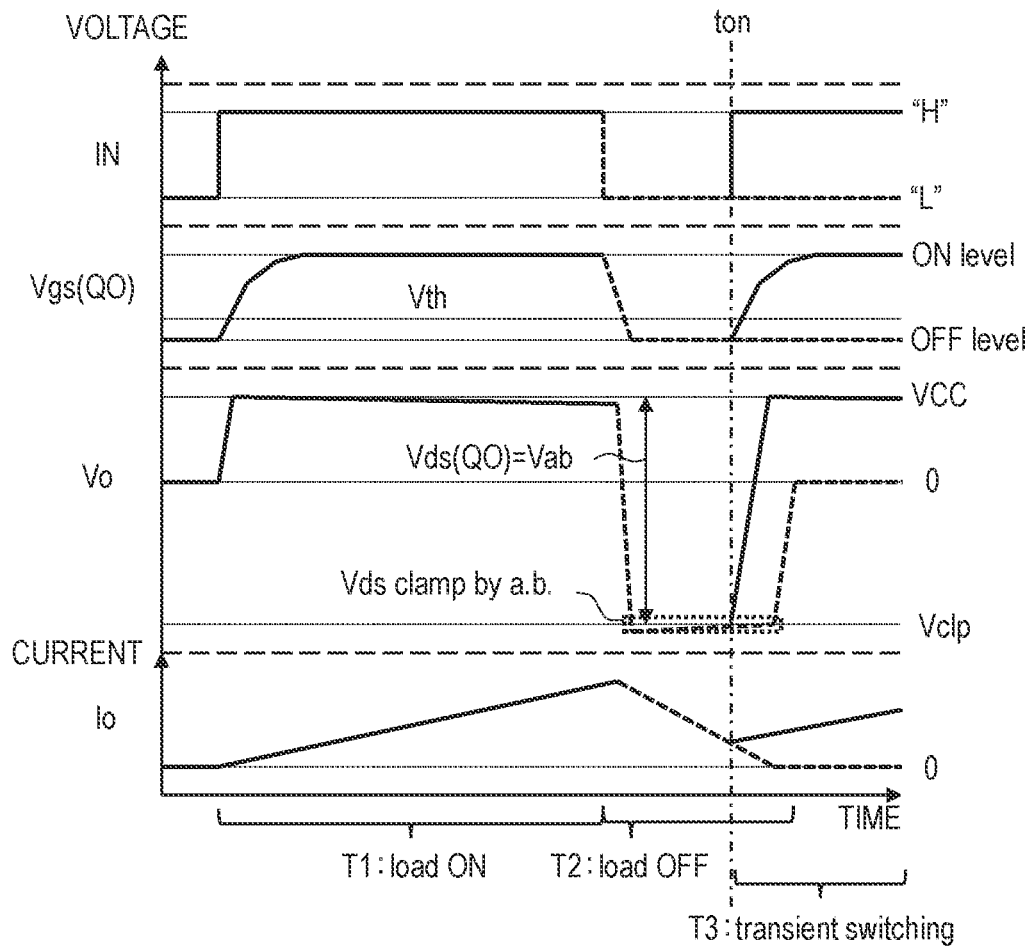
FIG. 13A is a waveform diagram showing an operation example of a power device as a comparative example.

FIG. 13A is a waveform diagram showing an operation example of a power device as a comparative example. In the power device as a comparative example, unlike the configuration example of FIG. 5, the protection circuit 32a is not provided. In FIG. 13A, a load ON period T1, a load OFF period T2, and a transient switching period T3 are shown. During the load ON period T1, the control input signal IN is "H" level, the output transistor QO is ON.

As a start condition of the load ON period T1, when the control input signal IN transitions from "L" level to "H" level, the output transistor QO switches from OFF to ON in response to control from the driver 30. As a result, the output voltage Vo of the load terminal PNl rises from the ground voltage GND toward the vicinity of the power supply voltage VCC, the output current Io is increased with a slope corresponding to the inductance or the like of the load 12. Further, in this period, electromagnetic energy is accumulated in the load 12.

In load OFF period T2, the control input signal IN is "L" level, the output transistor QO is OFF. As a start condition of this period, when the control input signal IN transitions from "H" level to "L" level, the output transistor QO switches from ON to OFF in response to control from the driver 30. As a result, the output voltage Vo of the load terminal PNl is lowered from the vicinity of the power supply voltage VCC, the output current Io is reduced by a slope corresponding to the inductance or the like of the load 12.

Here, when the output transistor QO is switched from ON to OFF, since the electromagnetic energy stored in the load 12 is emitted, the back electromotive voltage is generated at the load terminal PNl. As a result, the output voltage Vo drops to a value lower than 0 V. Then, when the drain-source voltage Vds of the output transistor QO exceeds the avalanche breakdown voltage Vab, the output voltage Vo is clamped in the vicinity of the clamping voltage Vclp determined based on the avalanche breakdown voltage Vab. Thereafter, when the output current Io is reduced to 0 A, i.e., when the emission of electromagnetic energy is completed, the output voltage Vo is increased from near the clamping voltage Vclp to 0 V.

Transient switching period T3 is any timing ton while the output voltage Vo is clamped in the vicinity of the clamping voltage Vclp, and is a period after the control input signal IN has transitioned from "L" level to "H" level. In response to the transition from the "L" level to the "H" level of the control input signal IN, the output transistor QO switches from OFF to ON. Consequently, the output voltage Vo rises toward the vicinity of the power supply voltage VCC from the vicinity of the clamping voltage Vclp. Here, the output transistor QO is switched ON at the timing ton with a large drain-source voltage Vds to flow the output current Io. Therefore, large power is generated in the output transistor QO.

Figure 13B:
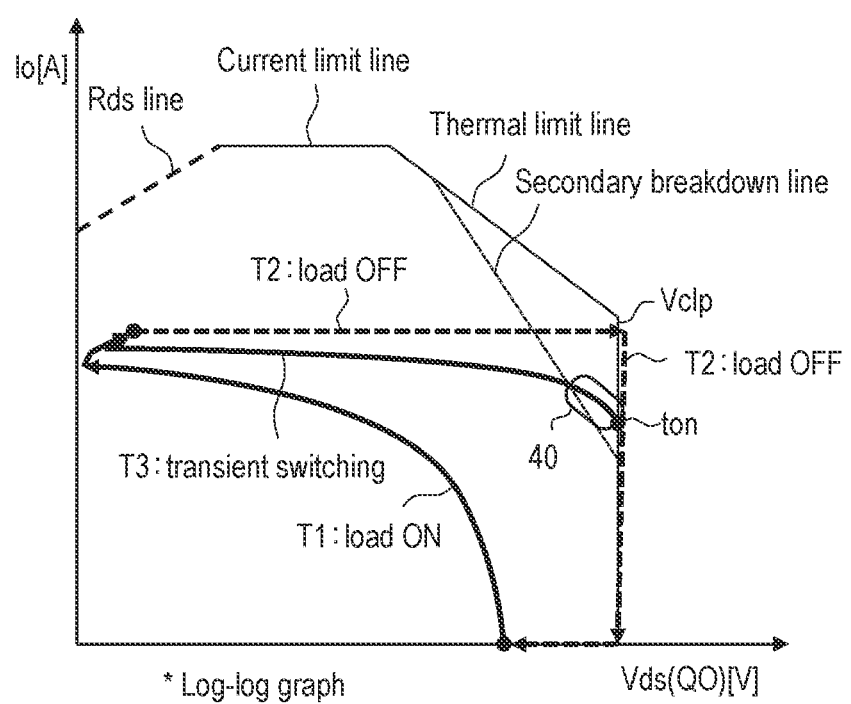
FIG. 13B is a diagram showing a correspondence between the safe operation region (SOA) of the output transistor and the operation example of the output transistor in FIG. 13A.

FIG. 13B is a diagram showing the correspondences between the safe operation region (SOA) of the output transistor and the operation examples of the output transistor 13A in FIG. 3. In FIG. 13B, the horizontal axis represents the drain-source voltage Vds of the output transistor QO, and the vertical axis represents the output current Io flowing through the output transistor QO. The safe operating area (SOA) is defined by the Rds line, the current limit line, the thermal limit line and the secondary breakdown line as shown in FIG. 13B. Strictly speaking, each of these lines varies with the duration of each operation. However, for the sake of simplicity, it is assumed that the duration of each operation, that is, the length of each of the times T1 to T3 shown in the drawing 13A, is equal.

As shown in FIG. 13B, the operating points in the load-on period T1 are within the SOA range. Also, for each operating point in the load OFF period T2, some operating points may be outside the range of SOA because they exceed the secondary breakdown line due to the back EMF voltage. However, in the load OFF period T2, the output transistor QO is OFF. Therefore, the destruction of the output transistor QO does not occur.

On the other hand, in the load OFF period T2, at any timing ton while the drain-source voltage Vds is clamped in the vicinity of the clamping voltage Vclp, when the output transistor QO is switched from OFF to ON, each operating point in the transient switching period T3 occurs. At a part of the operating point 40 in the transient switching period T3, the output transistor QO is turned on in a state exceeding the secondary breakdown line, that is, outside the range of the SOA.

As a result, the output transistor QO may be destroyed. In particular, as shown in FIG. 4, in the output transistor QO with reduced on-resistance using the super junction structure or the like, there is a case where the SOA associated with the secondary breakdown line is narrowed. In this case, it may be more difficult to satisfy the SOA. Further, in the method shown in Patent Document 1 or Patent Document 2, the output transistor QO will be half-turned on in a state where the back EMF voltage is applied. The half-on timing may be the timing ton shown in FIG. 13B. In this case, there is a possibility that the destruction of the output transistor QO cannot be sufficiently prevented.

<Details of Protection Circuit>

Therefore, as shown in FIG. 5, the power device 20a includes a protection circuit 32a. Protection circuit 32a includes two current passes CP1n, CP2a formed between the power supply terminal PNv and the load terminal PNl, a current mirror circuit CMp1, and a control transistor MNc1 which is an nMOS transistor. In the current pass CP1n, a detection transistor MNd which is an nMOS transistor and an adjusting resistor element R11 are inserted.

The gate and source of the detection transistor MNd, respectively, are coupled to the ground terminal PNg and the load terminal PNl. Thus, the detection transistor MNd flows the detection current IdN through the current path CP1n when the output voltage Vo at the load terminal PNl is lower than the ground voltage GND, in particular, lower than GND by a threshold voltage (Vth).

Current mirror circuit CMp1 includes a pMOS transistor MP11 which is a mirror source and a pMOS transistor MP12 which is a mirror destination. The current mirror CMp1 transfers the detection current IdN flowing in the current pass CP1n to the current pass CP2a. Specifically, the detection current IdN flows from a drain of the pMOS transistor MP11, and a mirror current I2a proportional to the detection current IdN flows from a drain of the pMOS transistor MP12. Note that sources of pMOS transistors MP11,MP12 are coupled to the power supply terminal PNv. Adjusting resistor element R11 is provided between the pMOS transistor MP11 and the detection transistor MNd to adjust the magnitude of the detection current IdN.

In the current pass CP2a, a resistor element R12 and a detecting resistor element Rd1 are inserted. One end of the detecting resistor element Rd1 is coupled to the load terminal PNl. Detecting resistor element Rd1 converts the mirror current I2a flowing in the current path CP2a to a detection voltage Vd1. The resistor element R12 is provided between the detecting resistor element Rd1 and the pMOS transistor MP12. A resistor divider circuit constituted by the resistor element R12 and the detecting resistor element Rd1 adjusts the magnitude of the detection voltage Vd1.

A gate and a source of the control transistor MNc1 are respectively coupled to both ends of the detecting resistor element Rd1. Thus, the control transistor MNc1 is turned on when the detection voltage Vd1 converted by the detecting resistor element Rd1 is a predetermined value, i.e., higher than a threshold voltage (Vth). Then, the output transistor QO is controlled to be OFF while the control transistor MNc1 is ON.

Specifically, the control node of the output transistor QO and the load terminal PNl are short-circuited by the control transistor MNc1 during the on-period since the drain of MNc1 is connected to the control node (gate G) of the output transistor QO. Further, the control transistor MNc1 is provided with a higher driving capability than the driver 30, it is possible to flow a larger discharge current than the charging current from the driver 30.

Then, the control transistor MNc1, in the ON period, shorts between the control node of the output transistor QO and the load terminal PNl regardless of the operation of the driver 30. Specifically, for example, even when the driver 30 is controlling the gate-source voltage Vgs of the output transistor QO to the ON level, the control transistor MNc1 can control the output transistor QO to the OFF due to the difference in the driving capability described above.

<Circuit Operation of the Power Device (First Embodiment)>

Figure 6:
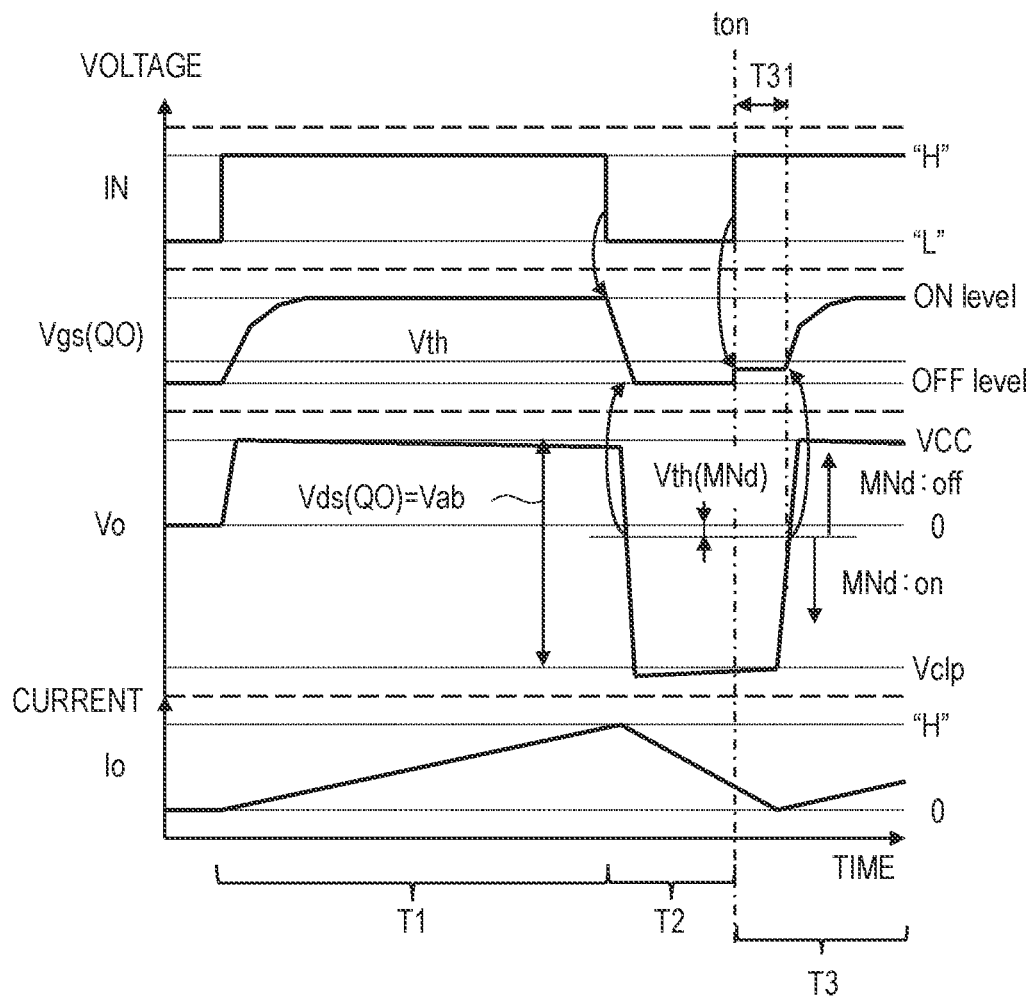
FIG. 6 is a waveform diagram showing an operation example of the power device shown in FIG. 5.

FIG. 6 is a waveform diagram showing an operation example of the power device shown in FIG. 5. In FIG. 6, as in the case of FIG. 13A, the load ON period T1, the load OFF period T2, an operation example in the transient switching period T3 is shown. Load ON period T1 is the period when the control input signal IN is "H" level and the output transistor QO is ON. The load OFF period T2 is a period when the control input signal IN is "L" level and the output transistor QO is OFF. Transient switching period T3 is any timing ton while the output voltage Vo is clamped in the vicinity of the clamping voltage Vclp and is a period after the control input signal IN is transitioned from "L" level to "H" level.

Here, in FIG. 6, as compared with the case of FIG. 13A, the operations in the load OFF period T2 and the transient switching period T3 are different. In the load OFF period T2, in response to switching from ON to OFF state of the output transistor QO, when the output voltage Vo is reduced to a predetermined value or less, the detection transistor MNd is switched from OFF to ON. The predetermined value, using the threshold voltage Vth of the detecting transistor MNd, is "−|Vth|". When the detection transistor MNd is switched from OFF to ON, the detection current IdN flows in the current pass CP1n.

When the detection current IdN flows, by the current mirror circuit CMp1, the mirror current I2a also flows in the current path CP2a. The detecting resistor element Rd1 converts the mirror current I2a to the detection voltage Vd1. When the detection voltage Vd1 is greater than the threshold voltage (Vth) of the control transistor MNc1, the control transistor MNc1 switches from OFF to ON and shorts between the gate (G) and source (S) of the output transistor QO. Consequently, the output transistor QO is controlled to the OFF level (the gate-source voltage Vgs is 0 V) by the driver 30 and is also controlled to the OFF level by the control transistor MNc1.

Thereafter, the drain-source voltage Vds of the output transistor QO exceeds the avalanche breakdown voltage Vab, and the output voltage Vo is clamped near the clamping voltage Vclp. Then, the output transistor QO consumes the electromagnetic energy emitted from the load 12 by passing the output current Io associated with the avalanche breakdown. Here, at the timing ton while the output voltage Vo is clamped in the vicinity of the clamping voltage Vclp, when the control input signal IN transitions from "L" level to "H" level, it switches to the transient switching period T3.

At timing ton, the driver 30 applies a charge current to the gate (G) of the output transistor QO to control the gate-source voltage Vgs of the output transistor QO to an ON level, e.g., the level of the supply voltage VCC. On the other hand, since the gate-source voltage of the detection transistor MNd is greater than the threshold voltage Vth, the detection transistor MNd remains ON. Here, the discharge current by the control transistor MNc1 is larger than the charging current by the driver 30. Therefore, the gate-source voltage Vgs of the output transistor QO does not exceed the threshold voltage Vth and the output transistor QO maintains OFF.

Thereafter, when the output current Io is reduced to 0 A, i.e., when the emission of electromagnetic energy by the load 12 is completed, the output voltage Vo is increased from around the clamping voltage Vclp. Then, when the output voltage Vo is higher than the predetermined value "−|Vth|" described above, the detection transistor MNd switches from ON to OFF. Consequently, the detection current IdN becomes zero and the control transistor MNc1 switches from ON to OFF. In response, the gate-source voltage Vgs of the output transistor QO is raised toward the ON level by the charge current from the driver 30, and the output transistor QO is switched from OFF to ON.

Main Effect of First Embodiment

As described above, in the semiconductor device of the first embodiment, the protection circuit 32a is provided. Thus, during the period in which the back EMF voltage is generated in the load terminal PNl, i.e., the period in which a large drain-source voltage Vds is applied to the output transistor QO, even if the control input signal IN is "H" level, it is possible to maintain OFF state of the output transistor QO. Then, during the period in which OFF state of the output transistor QO is maintained, the electromagnetic energy of the load 12 can be consumed by the avalanche breakdown of the output transistor QO.

Thus, by maintaining OFF state of the output transistor QO in a period in which the back EMF voltage is generated in the load terminal PNl, it is possible to prevent destruction due to the secondary breakdown of the output transistor QO. That is, it is possible to prevent the output transistor QO from being turned on or half-on at the operating point 40 outside the SOA as described in the drawing 13B. Further, with this, it becomes easy to apply the super junction structure or the like, it is easy to reduce the on-resistance of the output transistor QO. As a result, it can contribute to speed-up, low power consumption, improvement of reliability, etc. of engine control unit (ECU), etc.

Second Embodiment

<Circuit Configuration of Power Device (Second Embodiment)>

Figure 7:
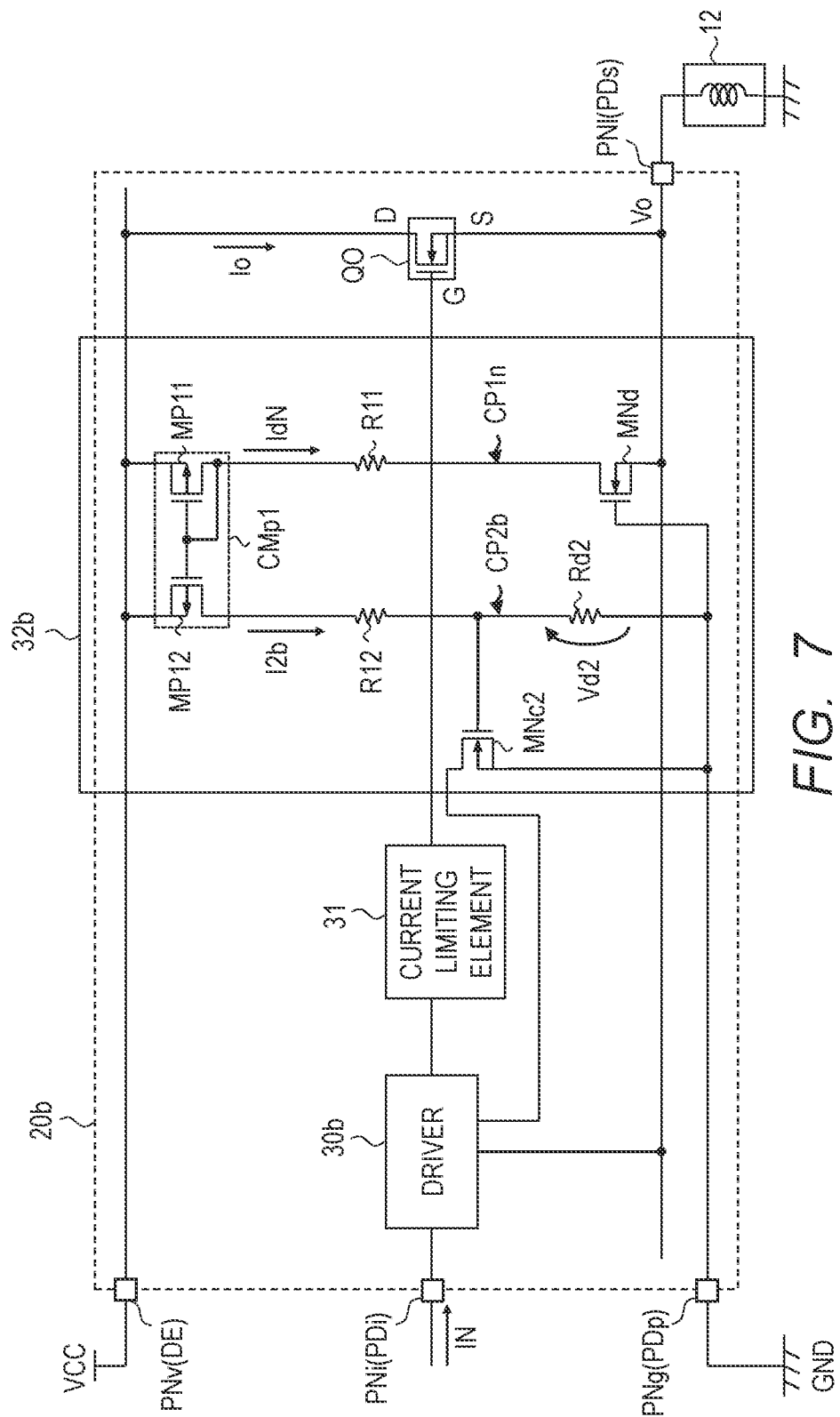
FIG. 7 is a circuit diagram showing a configuration example of a main portion of a power device according to a second embodiment.

FIG. 7 is a circuit diagram showing a configuration example of a main portion of the power device in a semiconductor device according to the second embodiment. In power device (semiconductor device) 20b shown in FIG. 7, as compared with the case of FIG. 5, the configuration of the driver 30b and the configuration of the protection circuit 32b are different. Different points between the protection circuit 32b in FIG. 7 and the protection circuit 32a in FIG. 5 are a connection destination of the current path CP2b which is a mirror destination of the current mirror circuit CMp1 and a connection destination of the control transistor MNc2.

Current path CP2b, unlike the case of FIG. 5, is formed between the power supply terminal PNv and the ground terminal PNg. Along with this, a detecting resistor element Rd2 is inserted into the current path CP2b such that one end of Rd2 is coupled to the ground terminal PNg and the other end is coupled to the gate of the control transistor MNc2.

The detecting resistor element Rd2 converts the mirror current I2b flowing though the current pass CP2b to a detection voltage Vd2.

A control transistor MNc2 has a source coupled to the ground terminal PNg and a drain coupled to the driver 30b. Thus, the control transistor MNc2, during ON based on the detection voltage Vd2, applies the ground voltage GND applied to the ground terminal PNg to the driver 30b. The driver 30b controls the gate-source voltage Vgs of the output transistor QO to the OFF-level, regardless of the control input signal IN, during the period in which the ground voltage GND is applied from the control transistor MNc2.

More particularly, the drain of the control transistor MNc2, for example, is coupled to the power supply terminal PNv via a resistor element or the like of a high resistance (not shown). In this case, the grounding voltage GND is applied to the driver 30b when the transistor MNc2 is ON, and the power supply voltage VCC is applied to the driver 30b when the control transistor MNc2 is OFF. Driver 30b, during the power supply voltage VCC is applied from the control transistor MNc2 side, controls ON level or OFF level of the gate-source voltage Vgs of the output transistor QO based on the control input signal IN.

Here, the ground voltage GND is applied to one end of the detecting resistor element Rd2 and source of the control transistor MNc2, but not limited thereto, another voltage may be applied. That is, it may be configured to notify the ON/OFF states of the control transistor MNc2 to the driver 30b.

<Circuit Operation of Power Device (Second Embodiment)>

Figure 8:
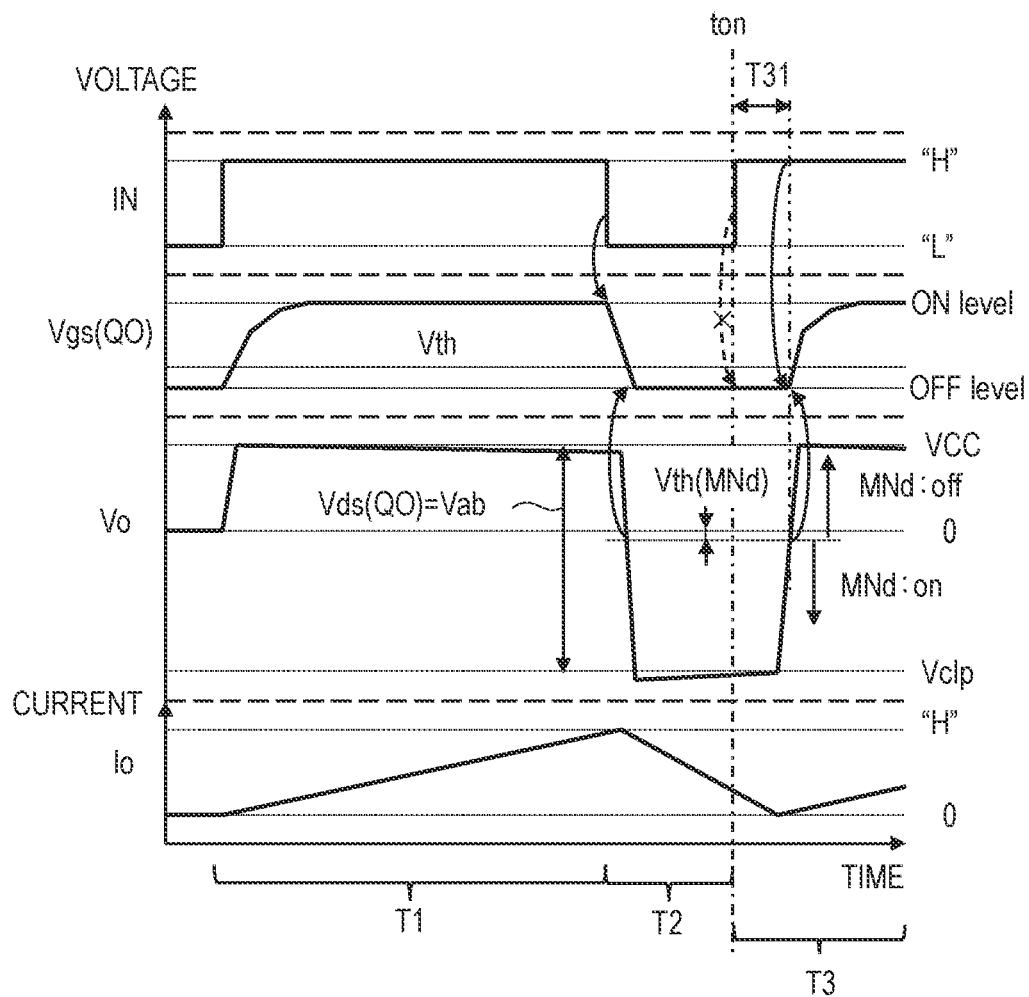
FIG. 8 is a waveform diagram showing an operation example of the power device shown in FIG. 7.

FIG. 8 is a waveform diagram showing an operation example of the power device shown in FIG. 7. In the operation example of FIG. 6 described above, during the period T31, the driver 30 supplies a charging current to the gate (G) of the output transistor QO. As a result, as shown in FIG. 6, during the period T31, the gate-source voltage Vgs of the output transistor QO may rise slightly from OFF-level (i.e., 0 V) by a range smaller than the threshold voltage Vth.

Due to the slight increase in the gate-source voltage Vgs of the output transistor QO, for example, there is a possibility that the output transistor QO is half-turned on. On the other hand, in the operation example of FIG. 7, unlike the case of FIG. 6, since the driver 30b does not supply the charging current to the gate (G) of the output transistor QO during the period T31, the gate source voltage Vgs of the output transistor QO is controlled to OFF level.

Main Effect of Second Embodiment

As described above, the same effects as the various effects described in the first embodiment can be obtained by using the semiconductor device according to the second embodiment. Furthermore, OFF state of the output transistor QO can be more reliably maintained during the period in which the back EMF voltage occurs at the load terminal PNl. This makes it possible to more reliably prevent a destruction due to secondary breakdown of the output transistor QO.

Third Embodiment

<Circuit Configuration of Power Device (Third Embodiment)>

Figure 9:
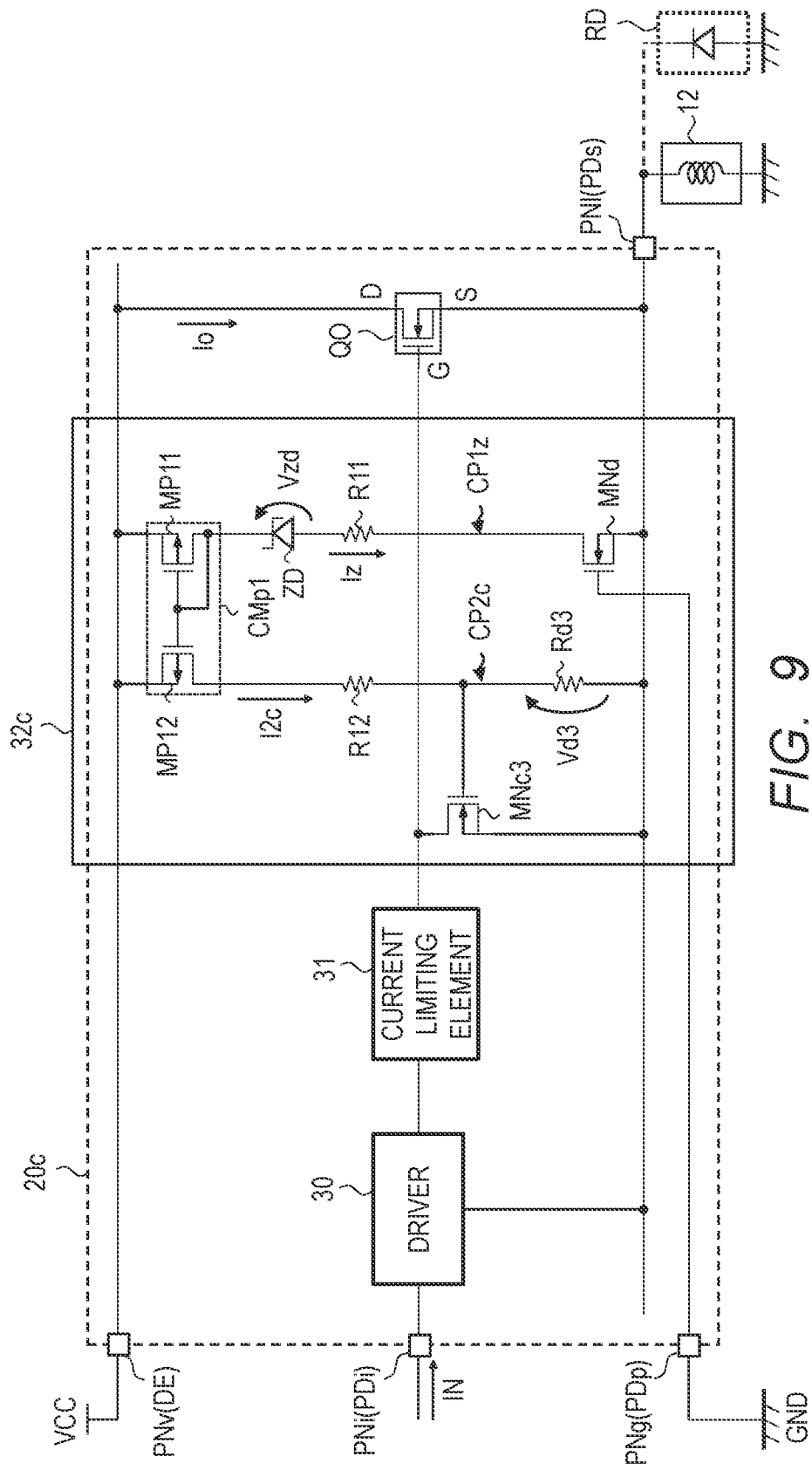
FIG. 9 is a circuit diagram showing a configuration example of a main portion of a power device according to a third embodiment.

FIG. 9 is a circuit diagram showing a configuration example of a main portion of the power device in a semiconductor device according to the third embodiment. In the power device (semiconductor device) 20c shown in FIG. 9, as compared with the case of FIG. 5, a configuration of the protection circuit 32c is different. In the protection circuit 32c, unlike the case of FIG. 5, in the current pass CP1z which is a mirror source of the current mirror circuit CMp1, a clamping element is inserted. The clamping element, in this example, is composed of a zener diode ZD having an anode coupled to the load terminal PNl side and a cathode coupled to the power supply terminal PNv side.

Zener diode ZD conducts when a voltage exceeding a clamping voltage (a Zener voltage Vzd) is applied to the cathode with reference to the anode. The Zener voltage Vzd is set to a value greater than the power supply voltage VCC. For example, when the power supply voltage VCC is 13 V, the Zener voltage Vzd is set to 18 V or the like. In this case, even when the back EMF voltage occurs in the load terminal PNl, when the drain-source voltage Vds of the output transistor QO is smaller than the Zener voltage Vzd, the detection current Iz does not flow through the current path CP1z. On the other hand, when the drain-source voltage Vds of the output transistor QO is larger than the zener voltage Vzd by the back EMF voltage, the detection current Iz flows through the current pass CP1z.

When the detection current Iz flows through the current path CP1z, the mirror current I2c flows through the current path CP2c which is a mirror destination by the current mirror circuit CMp1. Thereafter, as in the case of FIG. 5, the detecting resistor element Rd3 converts the mirror current I2c to the detection voltage Vd3. The control transistor MNc3 is switched ON/OFF by the detection voltage Vd3. Then, the control transistor MNc3 short-circuits the gate (G) and the source (S) of the output transistor QO during the ON-state. Incidentally, in FIG. 9, the connection order of the zener diode Z D and the adjusting resistor element R11 is interchangeable. Further, with respect to the configuration example of FIG. 7, it may be provided with the same clamping element as in the case of FIG. 9.

<Circuit Operation of Power Device (Third Embodiment)>

Figure 10:
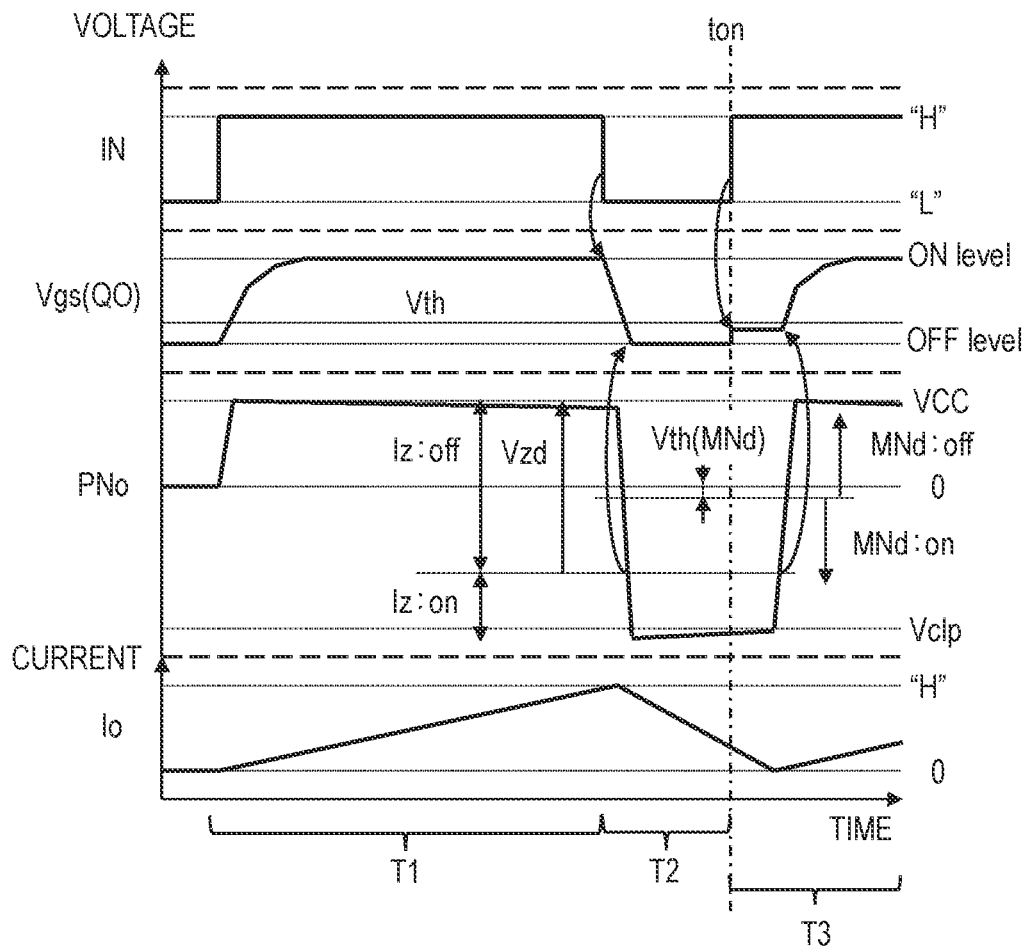
FIG. 10 is a waveform diagram showing an operation example of the power device shown in FIG. 9.

FIG. 10 is a waveform diagram showing an operation example of the power device shown in FIG. 9. In FIG. 10, as compared to FIG. 6, the condition for switching the control transistor MNc3 ON/OFF, and thus the condition that the output transistor QO is controlled to be turned off by the control transistor MNc3 is different. That is, in the case of FIG. 6, the control transistor MNc1 is turned on when the detection transistor MNd is turned on. In the case of FIG. 10, the control transistor MNc3 is turned on when the detection current Iz flows by conduction of the zener diode ZD.

Since the detection transistor MNd is turned on when a negative voltage occurs in the load terminal PNl by a different factor other than the back electromotive voltage, the protection circuit 32c malfunctions and the output transistor QO is turned off. It is possible to prevent this malfunction by this embodiment. For example, as a case in which the detection transistor MNd is turned on due to the factor other than the back electromotive voltage, the following first to third cases and the like can be cited. When the first to third cases or the like occur, it may be impossible to turn on the output transistor QO when necessary.

As the first case, noises called BCI (Bulk Current Injection) and DPI (Direct RF Power Injection) may continue to be inputted to the load terminal PNl. In this case, a negative voltage can always occur at the load terminal PNl. As the second case, the output voltage Vo may fluctuate due to ringing when restoring from avalanche breakdown. In this case, a negative voltage may occur again after once positive voltage occurs at the load terminal PNl. As the third case, as shown in FIG. 9, sometimes reflux diode RD is connected to the load terminal PNl. In this case, by the forward voltage of the reflux diode RD, or by external noise during reflux, a negative voltage may occur at the load terminal PNl.

When the configuration illustrated in FIG. 9 is used, even when the detection transistor MNd is turned on by the first to third cases or the like, the control transistor MNc3 is not turned on unless the negative voltage generated at the load terminal PNl is large enough to be regarded as the back electromotive voltage. In other words, only when a back EMF voltage occurs at the load terminal PNl, the control transistor MNc3 is turned on and the output transistor QO is controlled to be OFF. As a result, even when a negative voltage is generated at the load terminal PNl in the first to third cases or the like, malfunction of the protection circuit 32c can be prevented.

In the configuration shown in FIG. 9, the detection transistor MNd, for example, serves to prevent malfunction of the protection circuit 32c when the power supply voltage VCC is higher than an expected voltage. That is, if the detection transistor MNd is not provided, when the higher power supply voltage VCC than the Zener voltage Vzd is applied by a battery or the like, the detection current Iz flows. When providing the detection transistor MNd, such the detection current Iz does not flow.

Main Effect of Third Embodiment

As described above, the same effects as the various effects described in the first embodiment can be obtained by using the semiconductor device of the third embodiment Mode. Furthermore, it is possible to prevent malfunction of the protection circuit 32c when the negative voltage occurs due to a factor different from the back EMF voltage to the load terminal PNl.

Fourth Embodiment

<Circuit Configuration of Power Device (Fourth Embodiment)>

Figure 11:
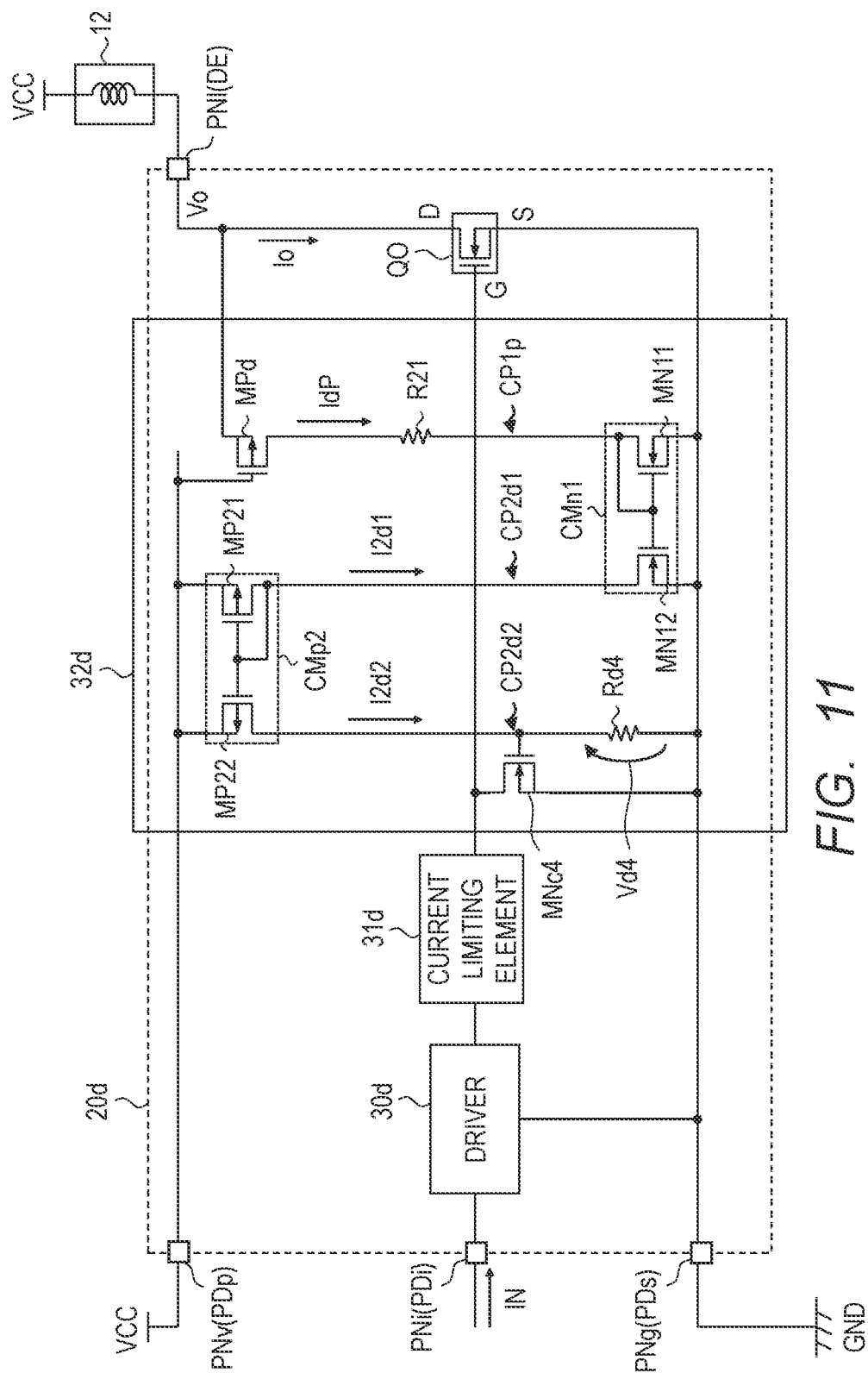
FIG. 11 is a circuit diagram showing a configuration example of a main portion of a power device according to a fourth embodiment.

FIG. 11 is a circuit diagram showing a configuration example of a main portion of the power device in a semiconductor device according to the fourth embodiment. While the power devices shown in embodiments 1 to 3 are connected to the high side of the load 12, the power device 20d shown in FIG. 11 is connected to the low side of the load 12.

Power device (semiconductor device) 20d shown in FIG. 11, as in the case of FIG. 5, includes the power supply terminal PNv, the control input terminal PNi, the ground terminal PNg, the load terminal PNl. However, unlike the case of FIG. 5, the power supply voltage VCC is applied to one end of the load 12, the other end of the load 12 is coupled to the load terminal PNl. The power device 20d includes the output transistor QO, the driver 30d, the current limiting element 31d, and the protection circuit 32d. Drain (D) and source (S) of the output transistor QO, respectively, are coupled to the load terminal PNl and the ground terminal PNg.

Further, unlike the case of FIG. 5, the power supply terminal PNv is also a power supply pad PDp. Load terminal PNl is also the drain electrode DE of the output transistor QO, the ground terminal PNg is also the source pad PDs of the output transistor QO. Incidentally, the control input terminal PNi, as in the case of FIG. 5, is also a control input pad PDi.

Driver 30d, based on the control input signal IN from the control input terminal PNi, controls the gate-source voltage Vgs of the output transistor QO via the current limiting element 31d. Driver 30d, unlike the case of FIG. 5, does not need to include a charge pump circuit. The driver 30d may be configured to output the power voltage VCC or ground voltage GND. Current limiting element 31d limits the charging and discharging current by the driver 30 using a resistor element or the like.

Protection circuit 32d includes a current path CP1p formed between the load terminal PNl and the ground terminal PNg, two current paths CP2d1, CP2d2 formed between the power supply terminal PNv and the ground terminal PNg, two current mirror circuits CMn1, CMp2, and a control transistor MNc4 which is a nMOS transistor. The detection transistor MPd which is a pMOS transistor and an adjusting resistor element R21 is inserted in the current pass CP1p.

Gate and source of the detection transistor MPd, respectively, are coupled to the power supply terminal PNv and the load terminal PNl. Thus, the detection transistor MPd flows the detection current IdP through the current path CP1p when the output voltage Vo occurring at the load terminal PNl is higher than the power supply voltage VCC, in particular, higher than VCC by the threshold voltage (Vth).

Current mirror circuit CMn1 includes a nMOS transistor MN11 which is a mirror source and a nMOS transistor MN12 which is a mirror destination. The current mirror CMn1 transfers the detection current IdP flowing through the current path CP1p to the current path CP2d1. Specifically, the detection current IdP flows through a drain of the nMOS transistor MN11, a mirror current I2d1 proportional to the detection current IdP flows through a drain of the nMOS transistor MN12. Note that the sources of nMOS transistors MN11, MN12 are coupled to the ground terminal PNg. Adjusting resistor element R21 is provided between the detecting transistor MPd and the nMOS transistor MN11 to adjust the magnitude of the detection current IdP.

Current mirror circuit CMp2 includes a pMOS transistor MP21 which is a mirror source and a pMOS transistor MP22 which is a mirror destination. The current mirror CMp2 transfers the mirror current I2d1 flowing through the current path CP2d1 to the current path CP2d2. Specifically, a mirror current I2d1 flows through a drain of the pMOS transistor MP21, a mirror current I2d2 proportional to the mirror current I2d1 flows through a drain of the pMOS transistor MP22. The sources of pMOS transistors MP21, MP22 are coupled to the power supply terminal PNv.

The detecting resistor Rd4 is inserted in the current pass CP2d2. One end of the detecting resistor Rd4 is coupled to the ground terminal PNg. The detecting resistor Rd4 converts the mirror current I2d2 flowing through the current path CP2d2 to a detection voltage Vd4. The gate and source of the control transistor MNc4 are respectively coupled to both ends of the detecting resistor element Rd4. The control transistor MNc4 is turned on when the detection voltage Vd4 converted by the detecting resistor element Rd4 is higher than a predetermined value, i.e., higher than the threshold voltage (Vth). Then, the output transistor QO is controlled to be off while the control transistor MNc4 is on.

Specifically, the control transistor MNc4 shorts between the control node of the output transistor QO and the ground terminal PNg during ON since the drain of the control transistor MNc4 is coupled to the control node (gate G) of the output transistor QO. Further, the control transistor MNc4 is provided with a higher driving capability than the driver 30d, and can flow a larger discharge current than the charging current from the driver 30d.

Then, the control transistor MNc4 shorts between the control node of the output transistor QO and the grounding terminal PNg during ON regardless of the operation of the driver 30d. Specifically, for example, even when the driver 30d is controlling the gate-source voltage Vgs of the output transistor QO to the ON level, the control transistor MNc4 can control the output transistor QO to the OFF due to the difference in the driving capability described above.

<Circuit Operation of the Power Device (Fourth Embodiment)>

Figure 12:
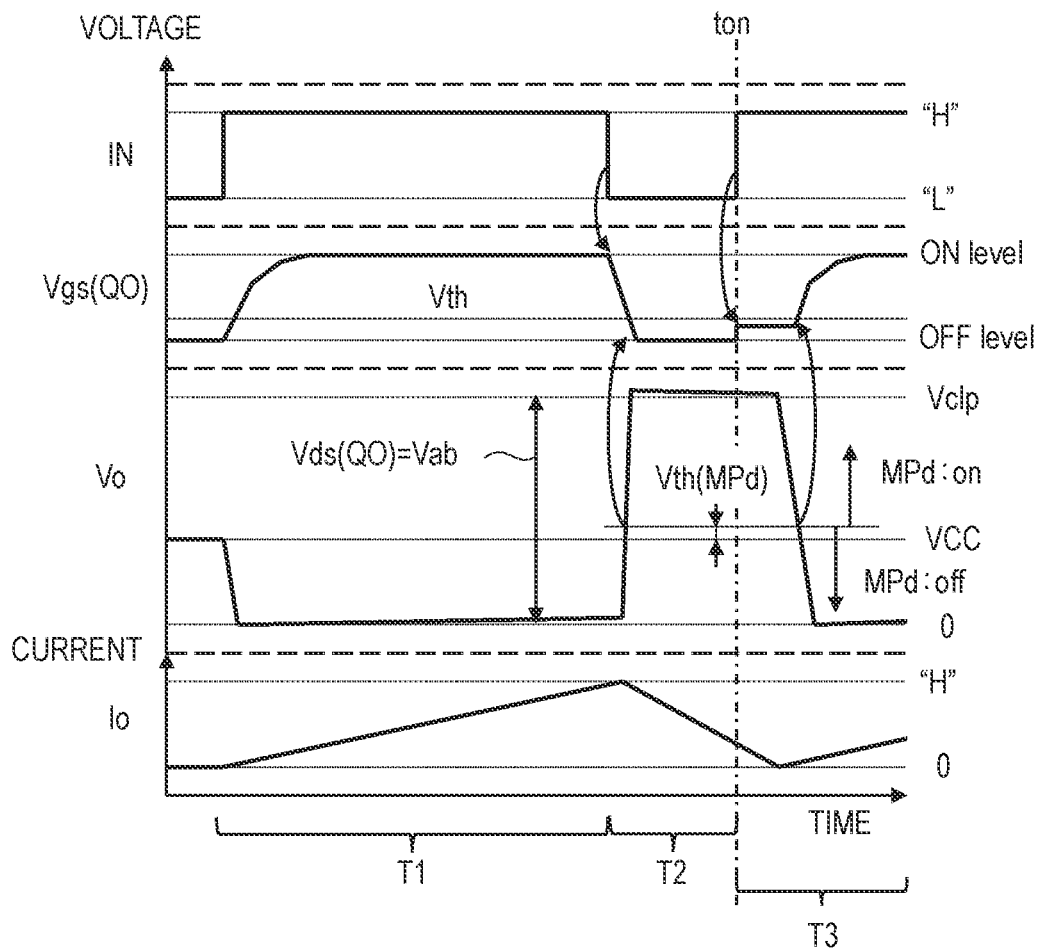
FIG. 12 is a waveform diagram showing an operation example of the power device shown in FIG. 11.

FIG. 12 is a waveform diagram showing an operation example of the power device shown in FIG. 11. In FIG. 12, as compared with the case of FIG. 5, the polarity of the output voltage Vo is different. That is, the output voltage Vo is controlled near 0 V (the ground voltage GND) during load-ON period T1 when the output transistor QO is turned on. Further, when switched from the load ON period T1 to the load OFF period T2 in response to the transition from the "H" level to the "L" level of the control input signal IN, a positive voltage due to the back EMF voltage occurs at the load terminal PNl.

As a result, the output voltage Vo rises from near the ground voltage GND. Then, when the output voltage Vo is higher than a predetermined value, the detection transistor MPd is switched from OFF to ON. The predetermined value is "VCC+|Vth|" using the threshold voltage Vth of the detection transistor MPd and the power supply voltage VCC. Further, in the output transistor QO, avalanche breakdown occurs due to the back electromotive voltage, and the output voltage Vo is clamped in the vicinity of the clamping voltage Vclp which is a positive voltage. The output transistor QO consumes the electromagnetic energy emitted from the load 12 by passing the output current Io associated with the avalanche breakdown.

Thereafter, in the timing ton when the output voltage Vo is clamped in the vicinity of the clamping voltage Vclp, when the control input signal IN transitions from the "L" level to the "H" level, switching from the load-OFF period T2 to the transient switching period T3 occurs. However, at timing ton, since the detection transistor MPd is ON, the output transistor QO maintains OFF. Thereafter, when the emission of electromagnetic energy of the load 12 is completed and the output voltage Vo is below the predetermined value "VCC+|Vth|" described above, the detection transistor MPd switches from ON to OFF. As a result, the output transistor QO is controlled to ON by the driver 30d.

The configuration example shown in FIG. 11 can be modified to the configuration example shown in FIG. 7. In this case, the drain of the control transistor MNc4 may be coupled to the driver 30d. The configuration example shown in FIG. 11 can be modified to the configuration example shown in FIG. 9. In this case, a clamping element may be inserted in the current pass CP1p. Specifically, for example, a Zener diode ZD whose anode is coupled to the ground terminal PNg side and whose cathode is coupled to the load terminal PNl side is provided as the clamping element.

Main Effect of Fourth Embodiment

As described above, the same effects as the various effects described in the first embodiment can be obtained by using the semiconductor device of the fourth embodiment.

Although the invention made by the present inventor has been specifically described based on the embodiment, the present invention is not limited to the embodiment described above, and various modifications can be made without departing from the gist thereof. For example, the foregoing embodiments have been described in detail for the purpose of explaining the present invention in an easy-to-understand manner, and are not necessarily limited to those having all the configurations described. In addition, a part of the configuration of one embodiment can be replaced with the configuration of another embodiment, and the configuration of another embodiment can be added to the configuration of one embodiment. It is also possible to add, delete, or replace some of the configurations of the respective embodiments.

What is claimed is:

1. A semiconductor device, comprising:
a first power supply terminal to which a first power supply voltage is applied;
a second power supply terminal to which a second power supply voltage lower than the first power supply voltage is applied;
a load terminal to which a load is coupled;
an output transistor which is coupled between the first power supply terminal and the load terminal and is controlled based on a control voltage between a control node thereof and the load terminal;
a driver which controls the control voltage based on a control input signal;
a first current path formed between the first power supply terminal and the load terminal;
a detection transistor which is inserted in the first current path and flows a detection current to the first current path in a period when an output voltage generated at the load terminal is lower than the second power supply voltage;
a current mirror circuit that transfers the detection current flowing through the first current path to a second current path;
a detection resistor element which is inserted in the second current path and converts a current flowing through the second current path to a detection voltage; and
a control transistor which is turned on in a period when the detection voltage converted by the detection resistor element is higher than a predetermined value,
wherein the output transistor is controlled to an off-state in a period when the control transistor is in an on-state.

2. The semiconductor device according to claim 1, wherein the detection resistor element has one end which is coupled to the load terminal and the other end which is coupled to the control node of the control transistor, and
wherein the control transistor short-circuits between the control node thereof and the load terminal in a period when the output transistor is in an on-state.

3. The semiconductor device according to claim 2, wherein the control transistor has a drive capability higher than the driver and short-circuits between the control node thereof and the load terminal regardless of an operation of the driver in a period when the control transistor is in the on-state.

4. The semiconductor device according to claim 1, wherein the detection resistor element has one end which is coupled to the second power supply terminal and the other end which is coupled to the control node of the control transistor,
wherein the control transistor applies the second power supply voltage applied to the second power supply terminal to the driver when the control transistor is in the on-state, and
wherein the driver controls the control voltage to an off level in a period when the second power supply voltage is applied from the control transistor.

5. The semiconductor device according to claim 1, further comprising:
an adjusting resistor element which adjusts a magnitude of the detection current.

6. The semiconductor device according to claim 1, further comprising:
a clamping element which is inserted in the first current path, and conducts when a voltage higher than a clamping voltage is applied between both ends thereof,
wherein the clamping voltage is set to a voltage greater than a difference voltage between the first power supply voltage and the second power supply voltage.

7. The semiconductor device according to claim 1, wherein the semiconductor device is composed of a single semiconductor chip.

8. A semiconductor device, comprising:
a first power supply terminal to which a first power supply voltage is applied;
a second power supply terminal to which a second power supply voltage lower than the first power supply voltage is applied;
a load terminal to which a load is coupled;
an output transistor which is coupled between the second power supply terminal and the load terminal and is controlled based on a control voltage between a control node thereof and the second power supply terminal;
a driver which controls the control voltage based on a control input signal;
a first current path formed between the second power supply terminal and the load terminal;
a detection transistor which is inserted in the first current path and flows a detection current to the first current path in a period when an output voltage generated at the load terminal is higher than the first power supply voltage;
a current mirror circuit that transfers the detection current flowing through the first current path to a second current path;
a detection resistor element which is inserted in the second current path and converts a current flowing through the second current path to a detection voltage; and
a control transistor which is turned on in a period when the detection voltage converted by the detection resistor element is higher than a predetermined value,
wherein the output transistor is controlled to an off-state in a period when the control transistor is in an on-state.

9. The semiconductor device according to claim 8, wherein the detection resistor element has one end which is coupled to the second power supply terminal and the other end which is coupled to the control node of the control transistor, and
wherein the control transistor short-circuits between the control node thereof and the second power supply terminal in a period when the output transistor is in an on-state.

10. The semiconductor device according to claim 9, wherein the control transistor has a drive capability higher than the driver and short-circuits between the control node thereof and the second power supply terminal regardless of an operation of the driver in a period when the control transistor is in the on-state.

11. The semiconductor device according to claim 8,
wherein the detection resistor element has one end which is coupled to the second power supply terminal and the other end which is coupled to the control node of the control transistor,
wherein the control transistor applies the second power supply voltage applied to the second power supply terminal to the driver when the control transistor is in the on-state, and
wherein the driver controls the control voltage to an off level in a period when the second power supply voltage is applied from the control transistor.

12. The semiconductor device according to claim 8, further comprising:
an adjusting resistor element which adjusts a magnitude of the detection current.

13. The semiconductor device according to claim 8, further comprising:
a clamping element which is inserted in the first current path, and conducts when a voltage higher than a clamping voltage is applied between both ends thereof,
wherein the clamping voltage is set to a voltage greater than a difference voltage between the first power supply voltage and the second power supply voltage.

14. The semiconductor device according to claim 8, wherein the semiconductor device is composed of a single semiconductor chip.

\* \* \* \* \*